(12) United States Patent
Bijnen et al.

(10) Patent No.: US 11,079,684 B2
(45) Date of Patent: Aug. 3, 2021

(54) MEASUREMENT APPARATUS AND A METHOD FOR DETERMINING A SUBSTRATE GRID

(71) Applicant: ASML NETHERLANDS B.V., Veldhoven (NL)

(72) Inventors: Franciscus Godefridus Casper Bijnen, Valkenswaard (NL); Edo Maria Hulsebos, Waalre (NL); Henricus Johannes Lambertus Megens, Waalre (NL); Robert John Socha, Campbell, CA (US); Youping Zhang, Cupertino, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/229,009

(22) Filed: Dec. 21, 2018

(65) Prior Publication Data
US 2019/0235391 A1    Aug. 1, 2019

Related U.S. Application Data

(60) Provisional application No. 62/773,576, filed on Nov. 30, 2018.

(30) Foreign Application Priority Data

Jan. 30, 2018    (EP) .................................... 18154053

(51) Int. Cl.
*G03F 7/20*        (2006.01)
*G03F 9/00*        (2006.01)
*G06F 30/39*       (2020.01)

(52) U.S. Cl.
CPC .......... *G03F 7/70425* (2013.01); *G03F 7/705* (2013.01); *G03F 7/7085* (2013.01);
(Continued)

(58) Field of Classification Search
CPC .................................................. G03F 7/70425
(Continued)

(56) References Cited

U.S. PATENT DOCUMENTS 6,952,253 B2    10/2005  Lof et al.
7,473,502 B1 *  1/2009  Ausschnitt .......... G03F 7/70516
                                                        430/22
(Continued)

FOREIGN PATENT DOCUMENTS

EP        1628164        2/2006
TW      200737297       10/2007
(Continued)

OTHER PUBLICATIONS

Taiwanese Office Action issued in corresponding Taiwanese Patent Application No. 108102658, dated Nov. 7, 2019.
(Continued)

*Primary Examiner* — Eric D Lee
(74) *Attorney, Agent, or Firm* — Pillsbury Winthrop Shaw Pittman LLP

(57) ABSTRACT

A measurement apparatus and method for determining a substrate grid describing a deformation of a substrate prior to exposure of the substrate in a lithographic apparatus configured to fabricate one or more features on the substrate. Position data for a plurality of first features and/or a plurality of second features on the substrate is obtained. Asymmetry data for at least a feature of the plurality of first features and/or the plurality of second features is obtained. The substrate grid based on the position data and the asymmetry data is determined. The substrate grid and asymmetry data are passed to the lithographic apparatus for controlling at least part of an exposure process to fabricate one or more features on the substrate.

20 Claims, 4 Drawing Sheets

(52) U.S. Cl.
CPC ...... *G03F 7/70516* (2013.01); *G03F 7/70633* (2013.01); *G03F 7/70683* (2013.01); *G03F 9/7046* (2013.01); *G03F 9/7088* (2013.01); *G06F 30/39* (2020.01)

(58) Field of Classification Search
USPC .......................................................... 716/51
See application file for complete search history.

(56) References Cited

U.S. PATENT DOCUMENTS

| | | | |
|---|---|---|---|
| 8,982,347 | B2 | 3/2015 | Wei et al. |
| 9,134,256 | B2 | 9/2015 | Smilde et al. |
| 9,778,025 | B2 | 10/2017 | Mathijssen et al. |
| 2003/0021467 | A1 | 1/2003 | Adel et al. |
| 2004/0059540 | A1 | 3/2004 | Matsumoto et al. |
| 2006/0016561 | A1 | 1/2006 | Choi et al. |
| 2007/0085991 | A1 | 4/2007 | Liegl et al. |
| 2010/0214550 | A1 | 8/2010 | Hulsebos et al. |
| 2010/0328655 | A1 | 12/2010 | Den Boef |
| 2011/0026032 | A1 | 2/2011 | Den Boef et al. |
| 2011/0102753 | A1* | 5/2011 | Van De Kerkhof .............. G01N 21/4788 355/27 |
| 2011/0249244 | A1 | 10/2011 | Leewis et al. |
| 2012/0008127 | A1 | 1/2012 | Tel et al. |
| 2012/0044470 | A1 | 2/2012 | Smilde et al. |
| 2013/0107241 | A1 | 5/2013 | Lafarre et al. |
| 2016/0140267 | A1 | 5/2016 | Chen et al. |
| 2016/0161863 | A1* | 6/2016 | Den Boef .............. G03F 7/705 355/67 |
| 2016/0170311 | A1 | 6/2016 | Schmitt-Weaver et al. |
| 2017/0068171 | A1 | 3/2017 | Moest et al. |
| 2017/0184980 | A1 | 6/2017 | Bogaart |
| 2017/0255112 | A1 | 9/2017 | Van Leest et al. |
| 2017/0261863 | A1 | 9/2017 | Downes et al. |
| 2018/0259855 | A1 | 9/2018 | Roset et al. |

FOREIGN PATENT DOCUMENTS

| | | |
|---|---|---|
| TW | 201327064 | 7/2013 |
| TW | 201514638 | 4/2015 |
| TW | 201539149 | 10/2015 |
| TW | I564677 | 1/2017 |
| TW | I564678 | 1/2017 |
| TW | 201721291 | 6/2017 |
| TW | 201734632 | 10/2017 |
| TW | 201743142 | 12/2017 |
| WO | 2011012624 | 2/2011 |
| WO | 2011081645 | 7/2011 |
| WO | 2013092106 | 6/2013 |
| WO | 2015018625 | 2/2015 |
| WO | 2015101458 | 7/2015 |
| WO | 2015110191 | 7/2015 |
| WO | 2017009036 | 1/2017 |
| WO | 2017060080 | 4/2017 |
| WO | 2017140532 | 8/2017 |
| WO | 2017144379 | 8/2017 |
| WO | 2017148982 | 9/2017 |
| WO | 2017149003 | 9/2017 |
| WO | 2018033499 | 2/2018 |
| WO | 2018069015 | 4/2018 |
| WO | 2018072962 | 4/2018 |
| WO | 2018072980 | 4/2018 |
| WO | 2019012495 | 1/2019 |

OTHER PUBLICATIONS

Taiwanese Office Action issued in corresponding Taiwanese Patent Application No. 108102658, dated Mar. 31, 2021.

* cited by examiner

MEASUREMENT APPARATUS AND A METHOD FOR DETERMINING A SUBSTRATE GRID

This application claims the benefit of priority of U.S. provisional application No. 62/773,576, filed Nov. 30, 2018, and of European patent application no. 18154053, filed Jan. 30, 2018. Each of the foregoing applications is incorporated herein in its entirety by reference.

FIELD

The present description relates to a measurement apparatus and a method for determining a substrate grid.

BACKGROUND

A lithographic apparatus is a machine constructed to apply a desired pattern onto a substrate. A lithographic apparatus can be used, for example, in the manufacture of devices such as integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such processing, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but are not limited to, optimization of NA, customized illumination schemes, use of phase shifting patterning devices, various optimization of the design layout such as optical proximity correction (OPC) in the design layout, or other methods generally defined as "resolution enhancement techniques" (RET). Additionally or alternatively, tight control loops for controlling a stability of the lithographic apparatus may be used to improve reproduction of a pattern at low k1.

SUMMARY

It is known to measure the position of several substrate alignment marks in order to produce a substrate grid which provides a description of a deformation of a substrate prior to exposure of the substrate in a lithographic apparatus. Embodiments described herein may have use in an EUV lithographic apparatus. Embodiments may have use in a deep ultraviolet (DUV) lithographic apparatus and/or another form of tool.

In an aspect, there is provided a method for determining a substrate grid describing a deformation of a substrate prior to exposure of the substrate in a lithographic apparatus configured to fabricate one or more features on the substrate, the method comprising: obtaining position data for a plurality of first features and/or a plurality of second features on the substrate; obtaining asymmetry data for at least a feature of the plurality of first features and/or the plurality of second features; determining the substrate grid based on the position data; and passing the substrate grid and asymmetry data to the lithographic apparatus for controlling at least part of an exposure process to fabricate one or more features on the substrate.

In an aspect, there is provided a measurement apparatus configured for determining a substrate grid describing a deformation of a substrate prior to exposure of the substrate in a lithographic apparatus configured to fabricate one or more features on the substrate, the measurement apparatus comprising: an optical system configured to obtain position data for a plurality of first features and/or a plurality of second features on the substrate, wherein the optical system is further configured to obtain asymmetry data for at least a feature of the plurality of first features and/or the plurality of second features, and wherein the measurement apparatus is configured to determine the substrate grid based on the position data or both the position and asymmetry data, and pass the substrate grid and asymmetry data to the lithographic apparatus for controlling at least part of an exposure process to fabricate one or more features on the substrate.

In an aspect, there is provided a method for determining a value for a process parameter measurement error obtained from measurement of a substrate subject to a manufacturing process and comprising a target having a process distortion, the process parameter measurement error being a result of the process distortion, the method comprising: obtaining alignment asymmetry data describing asymmetry in one or more alignment marks used for aligning the substrate; obtaining a model correlating alignment asymmetry data to the process parameter measurement error; and using the alignment asymmetry data and the model to obtain the value of the process parameter measurement error.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
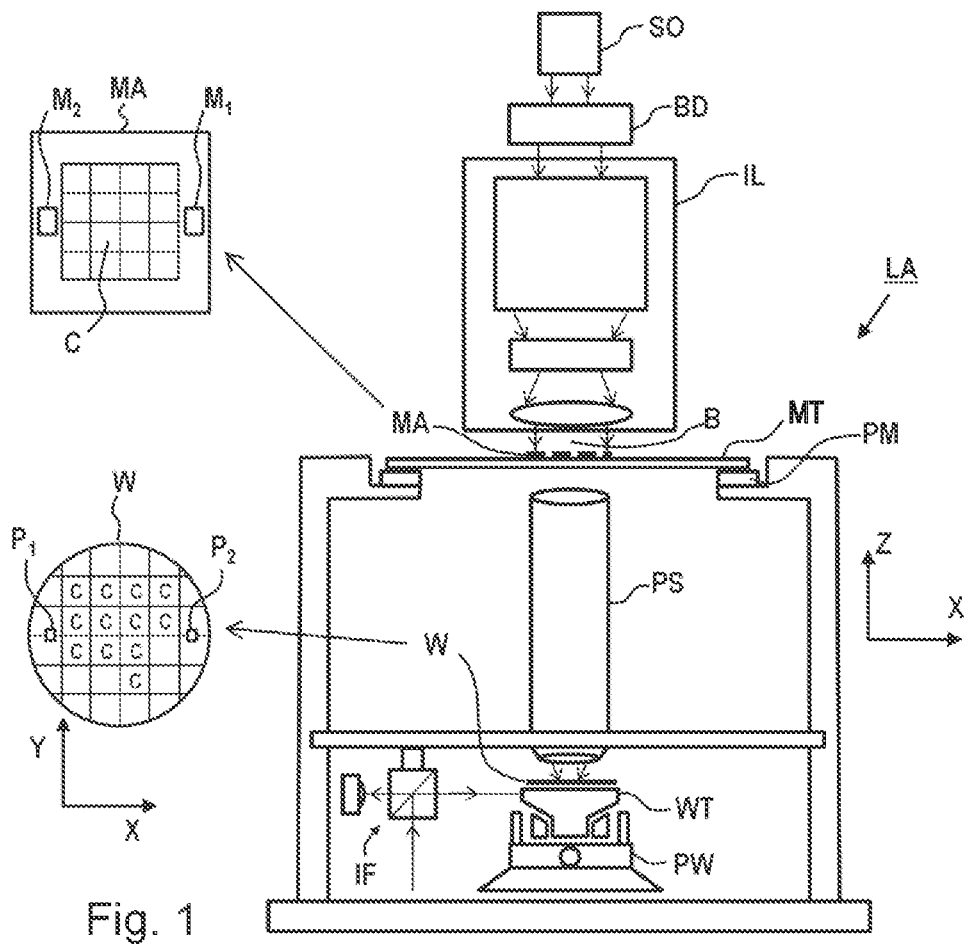
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA (or scanner) may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF (e.g., LA alignment sensor), the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
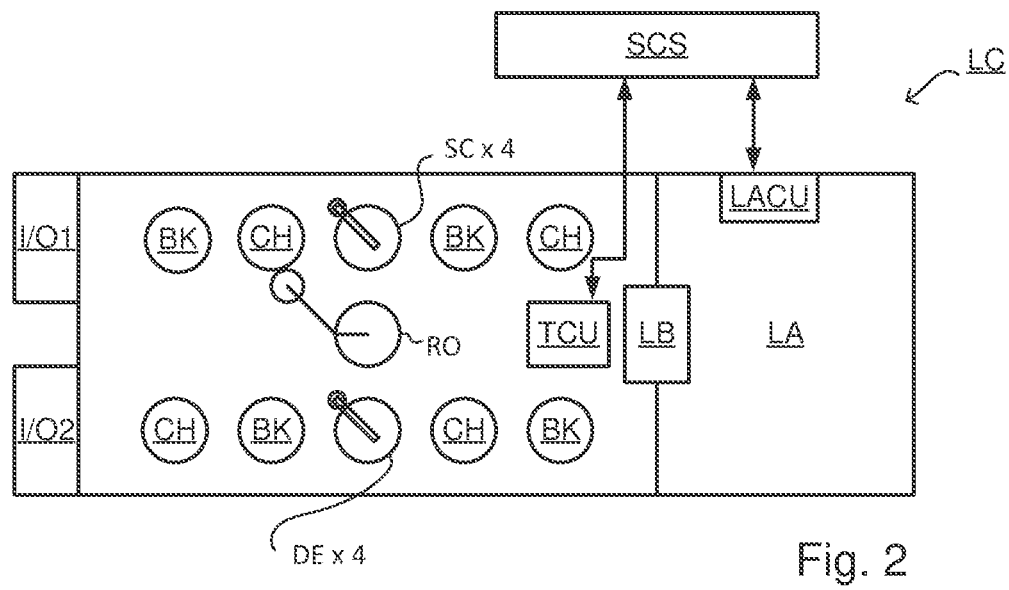
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include one or more spin coaters SC to deposit resist layers, one or more developers DE to develop exposed resist, one or more chill plates CH and/or one or more bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure a value of one or more properties of patterned structures, such as overlay error values between subsequent layers, line thicknesses, critical dimension values (CD), etc. For this purpose, one or more inspection tools (not shown) may be included in the lithocell LC. If an error is detected, an adjustment, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine one or more properties of the substrates W, and in particular, how values of one or more properties of different substrates W vary or how values of one or more properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the one or more properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
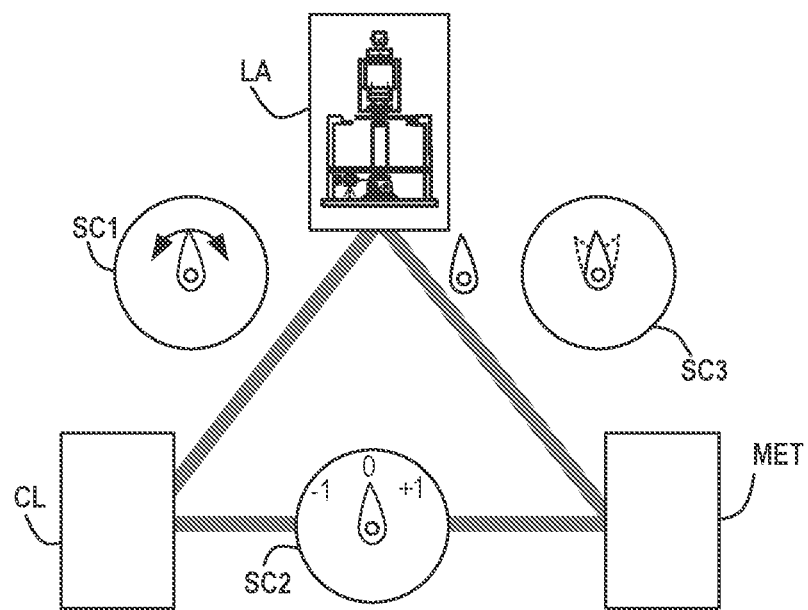
FIG. 3 depicts a schematic representation of a lithography technique involving a cooperation between three technologies to optimize semiconductor manufacturing.

Typically the patterning process in a lithographic apparatus LA is a significant step in the processing and involves high accuracy of dimensioning and placement of structures on the substrate W. To help ensure this high accuracy, three systems may be combined in a control environment as schematically depicted in FIG. 3. One of these systems is the lithographic apparatus LA which is (virtually) connected to a metrology tool MET (a second system) and to a computer system CL (a third system). An aim of such a control environment is to optimize the cooperation between these three systems to enhance the overall process window and provide tight control loops to help ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which patterning device (e.g., mask) layout and lithographic apparatus settings achieve a large or largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features should be within certain tolerances. Position errors may occur due to an overlay error (often referred to as "overlay"). The overlay is the error in placing a first feature during a first exposure relative to a second feature during a second exposure. The lithographic apparatus aims to reduce or minimize the overlay errors by aligning each substrate accurately to a reference prior to patterning. This is done by measuring positions of alignment marks on the substrate using an alignment sensor. More information on the alignment procedure can be found in U.S. Patent Application Publication No. US 2010-0214550, which is incorporated herein in its entirety by reference. Pattern dimensioning (CD) errors may e.g. occur when the substrate is not positioned correctly with respect to a focal plane of the lithographic apparatus. A focal position error may be associated with un-flatness of a substrate surface. The lithographic apparatus reduces or minimizes the focal position error by measuring the substrate surface topography prior to patterning using a level sensor. Substrate height corrections are applied during subsequent patterning to help assure correct imaging (focusing) of the patterning device pattern onto the substrate. More information on the level sensor system can be found in U.S. Patent Application Publication No. US 2007-0085991, which is incorporated herein in its entirety by reference.

Besides the lithographic apparatus LA and the metrology apparatus MET, one or more other processing apparatuses may be used during device production as well. An etching station (not shown) processes the substrates after exposure of the pattern into the resist. The etch station transfers the pattern from the resist into one or more layers underlying the resist layer. Typically etching is based on application of a plasma medium. One or more local etching characteristics may e.g. be controlled using temperature control of the substrate or directing the plasma medium using a voltage controlled ring. More information on etching control can be found in PCT Patent Application Publication No. WO 2011/081645 and U.S. Patent Application Publication No. US 2006-0016561, each of which is incorporated herein in its entirety by reference.

During the manufacturing of devices (such as ICs) it is desirable that the process conditions for processing substrates using one or more processing apparatuses such as the lithographic apparatus or etching station remain stable such that values of one or more properties of the features remain within certain control limits. Stability of the process is of particular significance for features of the functional parts of the device, the product features. To help ensure stable processing, process control capabilities should be in place. Process control involves monitoring of processing data and implementation of means for process correction, e.g. control the processing apparatus based on characteristics of the processing data. Process control may be based on periodic measurement by the metrology apparatus MET, often referred to as "Advanced Process Control" (also referred to as APC). More information on APC can be found in U.S. Patent Application Publication No. US 2012-0008127, which is incorporated herein in its entirety by reference. A typical APC implementation involves periodic measurements on metrology features on the substrates to monitor and correct drifts associated with one or more processing apparatuses. The metrology features reflect the response to process variations of the product features. The sensitivity of the metrology features to process variations may be different compared to the product features. In that case a so-called "Metrology To Device" offset (also referred to as MTD) may be determined. To mimic the behavior of product features the metrology targets may incorporate segmented features, assist features or features with a particular geometry and/or dimension. A carefully designed metrology target should respond in a similar fashion to process variations as the product features. More information on metrology target design can be found in PCT Patent Application Publication No. WO 2015/101458, which is incorporated herein in its entirety by reference.

The distribution of the locations across the substrate and/or patterning device where the metrology targets are present and/or measured is often referred to as the "sampling scheme". Typically the sampling scheme is selected based on an expected fingerprint of the relevant process parameter(s); areas on the substrate where a process parameter is expected to fluctuate are typically sampled more densely than areas where the process parameter is expected to be constant. Further there is a limit to the number of metrology measurements which may be performed based on the allowable impact of the metrology measurements on the throughput (e.g., number of substrates processed per unit time) of the lithographic process. A carefully selected sampling scheme is significant to accurately controlling the lithographic process without affecting throughput and/or assigning a too large area on the reticle or substrate to metrology features. Technology related to optimal positioning and/or measuring metrology targets is often referred to as "scheme optimization". More information on scheme optimization can be found in PCT Patent Application Publication Nos. WO 2015/110191 and WO 2018/069015, each of which is incorporated herein in its entirety by reference.

Besides metrology measurement data also context data may be used for process control. Context data may comprise data relating to one or more of: the selected processing tools (out of the pool of processing apparatuses), specific characteristics of the processing apparatus, the settings of the processing apparatus, the design of the patterning device pattern and/or measurement data relating to processing conditions (for example substrate geometry). Examples of using context data for process control purposes may be found in the PCT Patent Application Publication Nos. WO 2017/140532 and WO 2017/060080, each of which is incorporated herein in its entirety by reference. Context data may be used to control or predict processing in a feed-forward manner in case the context data relates to process steps performed before the currently controlled process step. Often context data is statistically correlated to one or more product feature properties. This enables context driven control of one or more processing apparatuses in view of achieving improved or optimal values of one or more product feature properties. Context data and metrology data may also be combined e.g. to enrich sparse metrology data to an extent that more detailed (dense) data becomes available which is more useful for control and/or diagnostic purposes. More information on combining context data and metrology data can be found in PCT Patent Application Publication No. WO 2017/144379, which is incorporated herein in its entirety by reference.

As the monitoring of a process is based on acquisition of data related to the process, the data sampling rate (per lot or per substrate) and sampling density depend on the desired level of accuracy of pattern reproduction. For low-k1 lithographic processes even small substrate to substrate process variations may be significant. The context data and/or metrology data should then be sufficient to enable process control on a per substrate basis. Additionally when a process variation gives rise to variations of a characteristic across the substrate, the density of the context and/or metrology data should be sufficiently distributed across the substrate. However the time available for metrology (measurements) is limited in view of the desired throughput of the process. As a result of this limitation, the metrology tool may measure only on selected substrates and/or selected locations across the substrate. Strategies to determine what substrates should be measured are further described in PCT Patent Application Publication Nos. WO 2018/072980 and WO 2018/072962, each of which is incorporated herein in its entirety by reference.

In practice, it may be necessary to derive a denser map of values from a sparse set of measurement values relating to a process parameter (across a substrate or plurality of substrates). Typically such a dense map of measurement values may be derived from the sparse measurement data in conjunction with a model associated with an expected fingerprint of the process parameter. More information on modeling measurement data can be found in PCT Patent Application Publication No. WO 2013/092106 which is incorporated herein in its entirety by reference.

In lithographic processes, it is desirable to make frequent measurements of the structures created, e.g., for process control and verification. Tools to make such measurement are typically called metrology tools. Different types of metrology tools for making such measurements are known, including scanning electron microscopes or various forms of scatterometer metrology tools. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. Patent Application Publication Nos. US 2010-0328655, US 2011-102753, US 2012-0044470, US 2011-0249244, and US 2011-0026032 and in European Patent Application Publication No. EP1628164. Each of the foregoing patent application publications is incorporated herein in its entirety by reference. Aforementioned scatterometers may measure gratings using radiation from soft x-ray radiation, extreme ultraviolet radiation, visible light to near-IR wavelength range.

In one arrangement, the scatterometer is an angular resolved scatterometer. In such a scatterometer reconstruction methods may be applied to the measured signal to reconstruct or calculate a value of one or more properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a further arrangement, the scatterometer is a spectroscopic scatterometer. In such a spectroscopic scatterometer, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

The scatterometer may be adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in, for example, two different layers (not necessarily consecutive layers), and may be formed substantially at the same position on the substrate. The scatterometer may have a symmetrical detection configuration as described e.g. in European Patent Application Publication No. EP1628164, which is incorporated herein in its entirety by reference, such that any asymmetry is clearly distinguishable. This provides a straightforward way to measure misalignment in gratings. Further examples for measuring overlay error between the two layers containing periodic structures as a target by measuring through asymmetry of the periodic structures may be found in PCT Patent Application Publication No. WO 2011/012624 and U.S. Patent Application Publication No. US 2016-0161863, each of which is incorporated herein in its entirety by reference.

Figure 4:
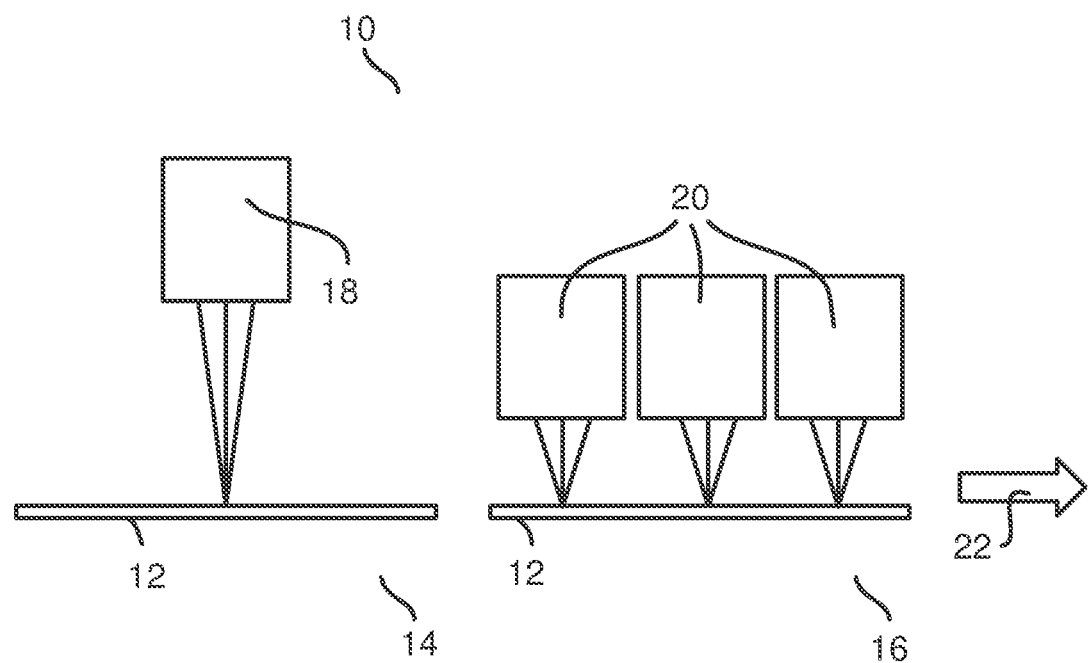
FIG. 4 depicts a schematic representation of a measurement apparatus for determining position and asymmetry of features.

FIG. 4 shows a measurement apparatus, hereafter referred to as a feed forward metrology cluster (FFMC) 10, which is positioned to take measurements from a substrate 12 prior to the substrate 12 being passed into the lithographic apparatus LA for exposure. The FFMC 10 may be positioned after the photoresist deposition tool and before the lithographic apparatus LA. The FFMC 10 may be a dual stage system having a first stage 14 and a second stage 16.

The first stage 14 of the FFMC 10 comprises an alignment sensor 18. Typically, first stage 14 may also comprise a sensor system providing leveling of the substrate with respect to the other sensor systems (e.g., the alignment sensor 18), typically referred to as a level sensor. Any class of level sensor may be utilized; e.g., a gas (e.g., air) gauge, an optical level sensor, a stamp based sensor (based on mechanical interaction with the substrate), etc. Typically a level sensor does not provide a single distance number between the substrate and the other sensors, but it samples the height of the substrate at a plurality of locations in order to determine a height profile of the substrate. The alignment sensor 18 is configured to measure position data of a plurality of first features, which in this exemplary case are alignment marks. The alignment marks may comprise diffraction gratings having a particular pitch. Typically the pitch of the alignment marks is substantially larger than the wavelength of the radiation used to measure the position of the alignment mark and hence the alignment sensor 18 may have a low numerical aperture (NA), desirably smaller than or equal to 0.9. In view of the required NA of the alignment sensor to measure the position of the first features, these first features are referred to herein as "low NA alignment marks".

It might be advantageous for the alignment sensor 18 to be a low NA sensor because alignment and leveling is done on the same substrate, and space is required between the level sensor and the substrate 12 to carry out the leveling.

To obtain the position data of the plurality of the low NA alignment marks, the alignment sensor 18 is scanned across the substrate 12 (e.g., by moving the substrate 12 relative to the alignment sensor 18).

The second stage 16 of the FFMC 10 comprises one or more, in this exemplary case three, metrology sensors 20 (i.e. optical systems) configured to measure the position of the plurality of low NA alignment marks. The metrology sensor 20 may also measure the asymmetry of a feature of the plurality of low NA alignment marks. In other examples, the second stage 16 may include more or less than three metrology sensors 20.

The metrology sensors 20 may comprise a high numerical aperture (NA) optical system, e.g. having an NA of greater than 0.9. That is, one or more of the metrology sensors 20 is a high NA sensor. Thus, as shown in step 102 of FIG. 7, position and asymmetry data for the low NA alignment marks may be obtained using a high-NA optical system comprising a sensor having a NA of greater than for example 0.9.

The metrology sensors 20 may be located relatively close to the substrate 12, when compared to the alignment sensor 18, and so can have a relatively large NA.

The metrology sensor 20 may for example measure position data of the low NA alignment marks by detecting the low NA alignment marks in the image plane of the metrology sensor 20, and the asymmetry data by viewing the low NA alignment marks in the pupil plane of the metrology sensor 20.

More particularly, analysis is carried out on radiation scattered from the low NA alignment marks. The asymmetry in intensities associated with a diffraction (angular) spectrum of the scattered radiation from the low NA alignment marks allows the asymmetry of the low NA alignment marks to be determined. The metrology sensor 20 may be a high NA sensor in order to be able to detect the diffraction spectrum of the scattered radiation.

Using multiple (e.g., three) metrology sensors 20 allows for an increased number of low NA alignment marks to be measured within a limited timeframe. The metrology sensors 20 may be spaced with respect to each other, such that the substrate 12 is located underneath them. Having three sensors 20 allows three measurements from three separate low NA alignment marks to be taken at the same time. This may allow, for example, 200 low NA alignment marks to be measured during the scanning of the substrate 12 by the metrology sensors 20 (e.g., by movement of the substrate 12 relative to the metrology sensors 20).

In other examples, one of the metrology sensors 20 may be an IR (infrared) sensor. An example of such an IR sensor is given in the European patent application no. EP 17181375.1, which is incorporated herein in its entirety by reference. The IR sensor may be configured to detect radiation having wavelengths that pass through an opaque layer of the substrate 12. This allows measurements to be taken of features (e.g. alignment marks) which are not possible using other metrology sensors 20. In other examples, one of the metrology sensors may be any suitable sensor that allows a measurement to be taken from below an upper (e.g. opaque) layer of the substrate 12.

Figure 7:
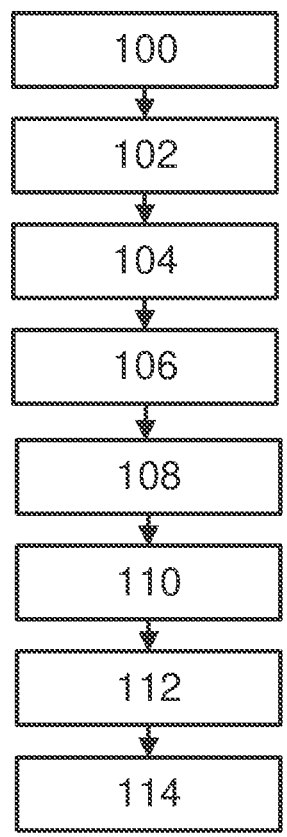
FIG. 7 depicts a flow diagram of the method for determining a substrate grid, alignment in the lithographic apparatus and measurement of overlay.

FIG. 7 represents a flow of a method according to an embodiment. First position data for a plurality of (e.g., low NA) alignment marks is obtained (e.g., using a low- and/or high-NA sensor) (step 100). Then asymmetry data of the (e.g., low NA) alignment marks is obtained; e.g., using a high-NA sensor (step 102).

Step 104 comprises determining a substrate grid based on the position data and optionally the asymmetry data. The substrate 12 may have been deformed from the processes it has been subjected to, and the substrate grid will show where these deformations are located. However, the low NA alignment marks may also have been deformed from the processes that the substrate 12 has been subjected to, i.e. the low NA alignment marks may have an asymmetry. This means that the position data from the low NA alignment marks may not be accurate and thus the substrate grid showing the deformation may not be accurate. The asymmetry data from the low NA alignment marks may be used to correct for the asymmetry of the low NA alignment marks and thus provide an improved substrate grid (an asymmetry-corrected substrate grid). In other words, the asymmetry data may be used to reduce or minimize the effect of the asymmetry of the low NA alignment marks on the substrate grid. As such, the asymmetry-corrected substrate grid may comprise a more accurate substrate grid describing a deformation of the substrate 12, as determined from the position and asymmetry data.

At step 106, this asymmetry-corrected substrate grid is sent to the lithographic apparatus. Alternatively, at step 106 (or in addition) the uncorrected substrate grid (a substrate grid based on position measurements only) may be determined and sent together with the asymmetry data to the lithographic apparatus.

As such, once the substrate grid has been determined and the asymmetry data has been measured, the substrate 12 is passed to the lithographic apparatus LA as shown by arrow 22 in FIG. 4, along with the asymmetry-corrected substrate grid and/or the uncorrected substrate grid and the asymmetry data.

Where the substrate grid forwarded at step 106 is uncorrected for asymmetry, the asymmetry-corrected substrate grid may be determined by/within the lithographic apparatus. This should be done before the substrate grid is used to control a subsequent step 108 of exposing the substrate to fabricate one or more features on the substrate.

Figure 5:
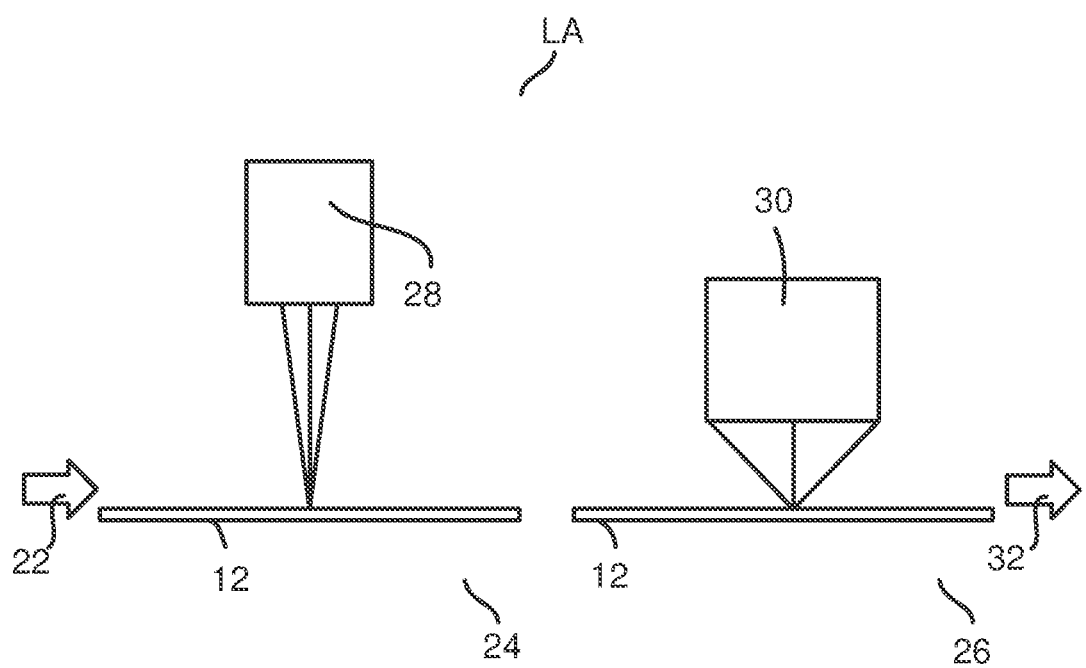
FIG. 5 depicts a schematic representation of an alignment and levelling sensor and an exposure apparatus in a lithographic apparatus.

FIG. 5 shows a lithographic apparatus having a LA first stage 24 and an LA second stage 26. In the LA first stage 24, a LA alignment sensor 28 (hereinafter referred to as LA alignment sensor 28) is provided. The LA alignment sensor 28 may be a low NA sensor. In the LA second stage 26, an exposure apparatus 30 is provided. After exposure of the substrate the substrate may be transferred to a metrology apparatus (for example an overlay measurement apparatus), as indicated by the arrow 32.

In conjunction with, e.g., position measurement system IF shown in FIG. 1, the LA alignment sensor 28 is used to align the substrate 12 in the lithographic apparatus LA and further determine a substrate grid as measured within the lithographic apparatus (the "lithographic apparatus substrate grid").

Where the substrate grid as determined by the FFMC 10 is an asymmetry-corrected substrate grid, as described, this already accurate substrate grid may be mapped to the substrate grid as determined by an alignment process in the lithographic apparatus (e.g., with the lithographic apparatus substrate grid). The substrate grid obtained by mapping the asymmetry-corrected substrate grid to the lithographic apparatus substrate grid may be used for controlling at least part of an exposure process to fabricate one or more features on the substrate 12 (step 108 of FIG. 7). This may comprise aligning the substrate 12 in the lithographic apparatus LA based on the substrate grid and asymmetry data (step 110 of FIG. 7), for example based on asymmetry-corrected substrate grid.

In case the substrate grid as determined by the FFMC 10 has not yet been corrected for asymmetry, the lithographic apparatus LA may use the substrate grid and the asymmetry data to reduce or minimize the effect of the asymmetry of the alignment marks on the lithographic apparatus substrate grid and the substrate grid as measured by the FFMC 10. A general method of using asymmetry data to improve accuracy of a substrate grid based on measurement of marks is disclosed in U.S. Pat. No. 9,778,025, which is incorporated herein in its entirety by reference.

Measuring the position data and asymmetry data of the low NA alignment marks prior to the substrate 12 being passed to the lithographic apparatus LA allows more alignment marks to be measured than can be carried out in the lithographic apparatus LA. This is because there is a time limit set for measurement in production (during exposure), e.g. to allow maximum throughput of substrates 12 in the lithographic apparatus LA. For example, using the FFMC 10 allows e.g. 200-600 measurements to be taken of the x-y position of the alignment marks which compares to only about 40 different alignment mark measurements that can be taken in the lithographic apparatus LA. The more marks that are measured, the better the accuracy of the determined substrate grid (representative of a certain substrate deformation).

In other examples, the metrology sensors 20 may measure position data of second features, which in an exemplary case may comprise metrology targets. The metrology targets may be an ensemble of composite gratings, formed by a lithographic process (e.g., either in resist (more common) or after an etch process). Typically the pitch and line-width of the structures in the gratings is selected based on the measurement optics (in particular the NA of the optics) to be able to capture diffraction orders coming from the metrology targets.

The diffracted radiation may be used to determine positional shifts between two layers (also referred to as 'overlay') or may be used to reconstruct at least part of the geometry of the grating as produced by the lithographic process. This reconstruction may be used to provide guidance of the quality of the lithographic process and may be used to control at least part of the lithographic process. The metrology targets may be overlay targets. The overlay targets may be a diffraction grating with a particular pitch, and the overlay targets are usually smaller than alignment marks. In other examples, the metrology sensors 20 may measure asymmetry data of the second features. The function of the second features (e.g., metrology targets) is in this document mostly associated with alignment purposes and since they need to be measured using a high NA sensor (the metrology sensors), they are referred to in this document as high NA alignment marks. The high NA alignment marks are typically densely distributed across the substrate and specifically distributed densely enough to allow characterization of the substrate deformation at a spatial scale comparable to individual exposure fields. The high NA alignment marks are for example positioned in the scribe lanes between the dies within the exposure fields and/or the scribe lanes between the exposure fields. In other words, measurement of positions associated with high NA alignment marks may allow a higher resolution (typically intra-field) characterization of the substrate grid.

The intra-field high NA alignment mark positions may be used to determine control targeted to optimize or improve exposure of individual fields across the substrate. The intra-field metrology data may be associated with the same layer of the substrate 12 as to which overlay is measured (lower grating of an overlay mark distributed across two layers). The intra-field data may be sampled at high spatial frequency across the substrate 12. The alignment data (of all fields) may be analyzed for substrate 12 and alignment mark (either low NA or high NA alignment mark) deformation. The positions of the intra-field high NA alignment marks may further be added to the substrate grid (initially based on the low NA alignment mark position measurements).

Effectively the positions of the intra-field high NA alignment marks as measured in the FFMC 10 are sent to the exposure apparatus 30. The additional data will improve the characterization of substrate-to-substrate variations of the substrate grid and the spatial accuracy of corrections performed during exposure using the lithographic apparatus. This will decrease the substrate-to-substrate variations of, for example, overlay quality as measured after exposure. All existing feedback, feedforward and Advanced Process Control loops may stay in place.

Asymmetry measurements can be taken from both the low NA alignment marks and the high NA alignment marks. The high NA alignment marks generally have a smaller pitch than the low NA alignment marks. The impact of processing (for example chemical mechanical planarization (CMP)) on the asymmetry of both mark types is normally not identical; typically asymmetry of smaller pitch marks is less sensitive to processing than asymmetry associated with larger pitch marks. Hence dedicated asymmetry measurements for both low NA and high NA alignment marks are typically used. However, in embodiments described below, this requirement may be mitigated or obviated.

In case both low NA alignment mark position data and high NA alignment mark positions are available they may be individually corrected using the available asymmetry data and, after correction, be merged to define a high resolution substrate grid. As described before, this high-resolution substrate grid may be mapped to the lithographic apparatus substrate grid and subsequently used to control the lithographic apparatus LA during exposure of the substrate.

Previously there was substrate-to-substrate variation in the substrate grid because there was insufficient high-frequency spatial information (for example information having a spatial resolution of 1-10 mm). The concepts described herein provide a high-resolution substrate grid, hence mitigating the problem considerably. Further, there was no intra-field substrate-to-substrate correction capability. The high-resolution substrate grid includes intra-field information and hence also this problem is considerably reduced. The alignment measurements done within the lithographic apparatus were limited to position measurements of low NA alignment marks, hence not directly corresponding to positions of metrology targets used for overlay control of the lithographic apparatus. It is proposed to include position measurements of high NA alignment targets, being typically identical to targets used for overlay measurements. Hence an embodiment of the invention provides an efficient way of controlling the lithographic apparatus based on alignment measurements expected to demonstrate a higher effectiveness in reducing substrate to substrate variations of measured overlay.

Typically a calibration is executed in order to match the FFMC 10 alignment results with those of the alignment results of the lithographic apparatus LA. This calibration covers mainly sensor to sensor and substrate table WT to substrate table WT differences between the FFMC 10 and the lithographic apparatus LA. The FFMC 10 alignment data is mapped to the alignment data of the lithographic apparatus LA. The alignment data may be taken from alignment markers on a reference substrate followed by storage of calibration parameters, or alternatively the alignment data may be taken from alignment markers for each substrate passing the FFMC and the lithographic apparatus.

One of the metrology sensors 20 may be calibrated to the LA alignment sensor 28 in order to correlate position measurements made by the metrology sensor 20 to the position measurements made by the LA alignment sensor 28. The low NA alignment mark positions would then need to be measured by both the FFMC 10 and the lithographic apparatus LA. Alternatively the metrology sensor 20 may be calibrated towards the alignment sensor 18 on the first stage of the FFMC 10. When the alignment sensor 18 is calibrated towards the LA alignment sensor 28 within the lithographic apparatus also the metrology sensor 20 will then be calibrated towards the alignment sensor 28.

At least a selection of position data associated with the plurality of high NA alignment marks may be calibrated towards position data associated with the plurality of low NA alignment marks. At least a selection of the position data may be calibrated towards further position data obtained during the aligning of the substrate 12 in the lithographic apparatus LA. In general it is desired that positions associated with a common set of low NA alignment marks are measured by the alignment sensor 18 on the first stage of the FFMC 10, the alignment sensor of the lithographic apparatus LA and the metrology sensors 20 on the second stage of the FFMC 10. Further position data obtained during the aligning of the substrate 12 in the lithographic apparatus LA may be calibrated towards at least a selection of the position data.

Figure 6:
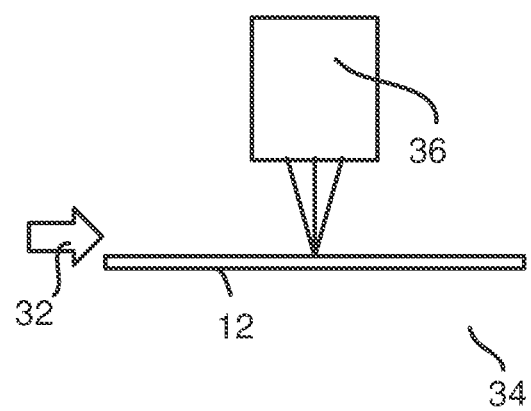
FIG. 6 depicts a schematic representation of a metrology apparatus for measuring overlay.

FIG. 6 shows an overlay measurement apparatus 36 which includes a stage 34. Overlay is a measure of how accurately the features on one layer of the substrate 12 are fabricated on top of underlying features of another layer of the substrate 12.

Using the asymmetry data of the high NA alignment marks allows better overlay measurements. This is because the asymmetry of the high NA alignment marks is likely to be the same as the asymmetry of the overlay targets. Thus, the asymmetry data of the high NA alignment marks may be passed to the metrology apparatus 36 for measuring overlay (step 112 of FIG. 7). At step 114 of FIG. 7, overlay data can be determined based on an overlay measurement and the asymmetry data from step 112. Using the asymmetry data of the high NA alignment marks provides an increase in accuracy of the overlay measurement as the positions of the overlay targets can be determined more accurately. An example of how asymmetry data is used to improve overlay measurement accuracy is disclosed in U.S. Pat. No. 9,134, 256, which is incorporated herein in its entirety by reference.

The asymmetry data is used to reduce or minimize the effect of the asymmetry of the overlay targets on the overlay measurement as done in the overlay measurement apparatus 36. An improved overlay measurement provides increased feedback accuracy to the lithographic apparatus LA.

There are two main optical OV (overlay) metrology concepts: image based OV metrology (IBO) and diffraction based OV metrology (DBO). In the case of IBO an OV target is built up of X and Y resist gratings that are spatially separated from X and Y gratings in the product layer. DBO uses gratings in an upper and lower layer but, in contrast to IBO, the gratings are not placed alongside each other but on top of each other. If the gratings are perfectly aligned (=zero overlay error) they form a symmetric composite grating with a symmetric scattering property. However, a small misalignment (overlay error≠0) creates an asymmetric composite grating which creates an asymmetry in the intensity of diffracted radiation.

Previously there was substrate-to-substrate variation in the metrology measurement due to a variation in Bottom Grating Asymmetry (BGA) per substrate. The BGA may now be measured prior to overlay measurement using the metrology sensors 20 within the FFMC. The determination of the overlay data may now use the asymmetry data associated with the lower grating part of the overlay target (as provided by the metrology sensors 20) leading to a smaller measured substrate to substrate variation of the overlay data.

Although the above description has shown that the FFMC 10 is located outside the lithographic apparatus LA, in other examples, the FFMC 10 may be located in the lithographic apparatus LA or may be part of the lithographic apparatus LA. Alignment in the lithographic apparatus LA may be considered to be similar to pre-exposure metrology. The alignment system in the lithographic apparatus LA may be capable of both measuring position of low NA alignment marks and high NA alignment marks and asymmetry of marks, e.g. by using a high NA sensor.

A further embodiment will now be described which determines a process distortion (e.g., a process asymmetry) in first features such as alignment marks (e.g., low NA alignment marks), and uses this to correct measurement of a process parameter such as overlay for process distortion (e.g., process asymmetry) in second features (e.g., metrology targets such as overlay targets used to measure overlay). The process asymmetry is the asymmetry induced by processing effects, such as a floor tilt or side wall angle asymmetry. This should be the only asymmetry in alignment marks; however overlay targets will typically comprise other asymmetries, induced by the overlay being measured and any deliberate bias, if present. In this embodiment the asymmetry in the alignment marks may be measured using FFMC 10. However, in another embodiment which will be described more fully, the asymmetry in the alignment marks is measured using the lithographic apparatus LA (e.g., as part of a standard alignment process using LA alignment sensor 28 to align the substrate for exposure). As such, this embodiment may or may not comprise use of an FFMC 10.

Currently, on a lithographic apparatus, there may be no feed forward of alignment mark asymmetry from the alignment mark measurement (e.g., by LA alignment sensor 28) to an overlay measurement performed on a metrology device (e.g., a scatterometry device), such as overlay measurement apparatus 36. Since the physics of the alignment sensor and metrology sensor are typically similar, i.e., based on interference of the +/−1 diffraction orders from a grating, it is reasonable to suppose that there is some correlation in the alignment position measurement to the overlay measurement, from mark asymmetry in the alignment mark and overlay target, respectively.

As already mentioned, because LA alignment sensor 28 typically measures targets (e.g., low NA alignment marks) which have a different (e.g., larger) pitch than the targets (e.g., high NA overlay targets) measured by overlay measurement apparatus 36, the effect of asymmetry on alignment measurement is different than the effect of asymmetry on overlay measurement. Asymmetry in the alignment mark causes an alignment error which, in turn causes an error in the overlay measurement which is additional to any error in the overlay measurement resultant from process (non-overlay/bias) asymmetry in the overlay target.

Process asymmetry in an alignment mark is typically different from process asymmetry in an overlay target due to loading effects. Furthermore, one or both of these process asymmetries may be different to in-product process asymmetries. Sometimes, there is no process asymmetry in-product, but there is process asymmetry in alignment and in overlay with the asymmetry being different for the two. In addition, the alignment error resultant from alignment mark asymmetry will typically be different than an overlay measurement error due to the overlay target process asymmetry, as overlay measurements and alignment measurements typically have different sensitivities to asymmetry in the respective feature being measured. Consequently, there is a complex coupling of overlay measurement error resultant from alignment mark asymmetry and resultant from overlay target process asymmetry. A method for decoupling these effects will be described.

The measured alignment grid, $\bar{a}_{meas}$ is a function $f$ of the true alignment grid $\bar{a}_{true}$ (i.e., the alignment grid without error due to mark asymmetry) and an alignment asymmetry component $\bar{a}_{asym}$ (error component) of the measured alignment grid, resultant from alignment mark asymmetry; i.e., $$\bar{a}_{meas} = f(\bar{a}_{true}, \bar{a}_{asym})$$

Measured overlay $\bar{o}_{meas}$ is a function g of the true overlay $\bar{o}_{true}$ (i.e., the overlay without error due to process asymmetry in the target), the measured alignment grid, $\bar{a}_{meas}$ and an overlay asymmetry component $\bar{o}_{asym}$ (error component) of the measured overlay, resultant from overlay target process asymmetry (asymmetry other than that due to overlay including any bias); i.e., $$\bar{o}_{meas} = g(\bar{o}_{true}, \bar{o}_{asym}, \bar{a}_{meas})$$

$$\bar{o}_{meas} = g(\bar{o}_{true}, \bar{o}_{asym}, f(\bar{a}_{true}, \bar{a}_{asym}))$$

The aim of this embodiment is to determine true overlay $\bar{o}_{true}$ from measured overlay $\bar{o}_{meas}$.

It has been observed that align position deviation APD, and more specifically, color-to-color align position deviation (hereafter C2C APD), is a quality metric of the alignment marks which is correlated with the overlay asymmetry component $\bar{o}_{asym}$. APD and C2C APD are each a measure of the asymmetry in the alignment mark. For example, this data may be measured using APD techniques or otherwise. APD techniques are described in U.S. Pat. No. 8,982,347 and PCT Patent Application Publication No. WO 2018/033499, each of which is incorporated herein its entirety by reference. C2C APD is the difference in align position for two wavelengths. More specifically, some alignment sensors will typically illuminate the alignment marks with a range of different wavelengths of radiation (colors), and perform a color-to-color analysis, such as C2C APD, to correct for alignment errors caused by alignment mark asymmetry. Comparison between signals obtained with different colors can indicate and quantify the presence of mark asymmetry.

It is proposed, therefore, that C2C APD be used to correct overlay measurements; for example as a feed-forward correction from an alignment measurement. Based on the C2C APD data, a correction for the effect of process asymmetry in an overlay target may be fed forward to an overlay measurement apparatus (or processing apparatus which processes overlay data from an overlay measurement apparatus) to correct an overlay measurement. In this way, it becomes possible to decouple the effects of overlay target process asymmetry and alignment mark asymmetry on the overlay measurement.

Figure 8:
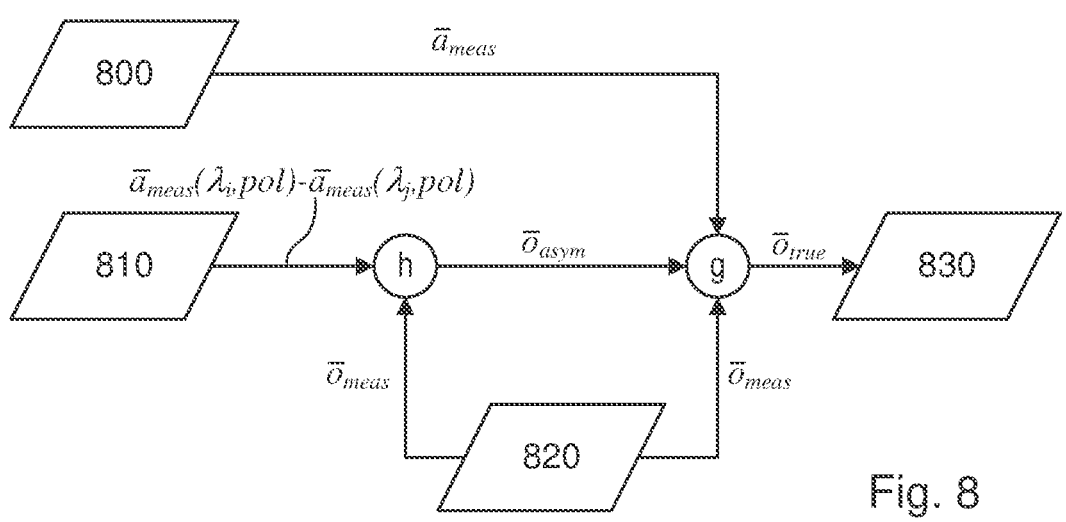
FIG. 8 depicts a flow diagram of a method for determining a value for an overlay measurement error according to an embodiment of the invention.

FIG. 8 is a flow diagram describing a method according to this embodiment. The measured alignment grid $\bar{a}_{meas}$ 800 is obtained. Alignment grid $\bar{a}_{meas}$ is a function of true alignment $\bar{a}_{true}$ and alignment asymmetry component $\bar{a}_{asym}$. C2C APD data 810 is obtained comprising the difference between the measured alignment grid, $\bar{a}_{meas}$ for at least two different wavelengths, e.g., $\lambda_i$ and $\lambda_j$ (for a given polarization pol); i.e., $\bar{a}_{meas}(\lambda_i, \text{pol}) - \bar{a}_{meas}(\lambda_j, \text{pol})$. The overlay asymmetry component $\bar{o}_{asym}$ is determined from the C2C APD data 810 and measured overlay data 820 $\bar{o}_{meas}$, via the application of a suitable function h, where $\bar{o}_{asym} = h[\bar{a}_{meas}(\lambda_i, \text{pol}), \bar{a}_{meas}(\lambda_j, \text{pol})]$. The measured alignment grid $\bar{a}_{meas}$ 800 may be obtained from the same measurement as that used to derive the C2C APD data 810.

The true overlay $\bar{o}_{true}$ 830 (corrected for the effect of overlay asymmetry component $\bar{o}_{asym}$) can then be calculated from measured overlay data 820 $\bar{o}_{meas}$, measured alignment grid 800 $\bar{a}_{meas}$ and overlay asymmetry component $\bar{o}_{asym}$ via the application of a suitable function g, where $\bar{o}_{meas} = g(\bar{o}_{true}, \bar{o}_{asym}, \bar{a}_{meas})$. In this way a feed forward overlay asymmetry correction is determined form the alignment data (more specifically C2C APD data 810) and applied to correct the overlay measurement.

A training or modeling phase should be performed to determine functions h and g. These functions may be determined through machine learning training and/or a suitable model. The model may be constructed, for example, by correlating the C2C APD data to an expected deformation characteristic (asymmetry) of the overlay targets. A suitable modelling technique may comprise that known as "Design for Control", abbreviated as D4C, which is described in U.S. Patent Application Publication No. US 2016-0140267, which is incorporated herein in its entirety by reference. In a D4C method, individual steps of a lithography process are modeled into a single process sequence to simulate the physical substrate processing. That process sequence drives the creation of the device geometry as a whole, rather than "building" the device geometry element-by-element. This is different from conventional approaches that use purely graphical volume elements in a three-dimensional schematic editor to build metrology targets. The method enables the automatic generation of robust metrology targets in the simulation domain, which can accommodate a variety of lithography processes and process perturbations.

As such, a calibration stage may comprise simulating (e.g., using the aforementioned D4C modelling technique or other suitable method) various alignment marks and overlay targets (e.g., having various different design parameters, pitches etc.) which have been subject to the same (simulated) processing and manufacturing steps on one or more common substrates (e.g., formed by common simulated deposition and/or exposure and/or etch processes etc.). The simulation may vary the effects of the various steps, and/or vary different degrees and/or types of asymmetry in the marks and targets. The simulated alignment marks and overlay targets, and corresponding simulated measurement data (e.g., data from simulated alignment measurements of the simulated alignment marks to obtain simulated C2C APD data and simulated overlay measurements of the simulated overlay targets to obtain simulated overlay data) can then be used as training data. Alternatively and/or in addition, the training data may comprise actual measurements on physical features (i.e., machine learning on actual measured data).

A machine learning technique can then be used to determine functions g and h from the relevant parameters of the simulated (and/or measured) alignment marks and overlay targets and simulated (and/or measured) measurement data (e.g., from the simulated measurement data and known true values and asymmetries from the simulated features). For example, the training data could train a neural network or Boolean network to determine functions g and h from the training data (this training may be measurement recipe specific or otherwise).

Once these functions are determined they can be used in a manufacturing setting to correct an overlay measurement (e.g., a single wavelength overlay measurement) for the effect of unwanted process asymmetry; i.e., asymmetry from effects other than overlay (including any deliberate biases) based on a feed-forward correction determined from the process asymmetry of alignment measurements (e.g., more specifically C2C APD measurements).

Alternatively, a suitable machine learning network (e.g., neural network or Boolean network) could be trained, using the training data, to determine true overlay $\bar{o}_{true}$ directly from the other measurement data, e.g., C2C APD measurement data $\bar{a}_{meas}(\lambda_i, \text{pol}) - \bar{a}_{meas}(\lambda_j, \text{pol})$ 810, alignment asymmetry component $\bar{a}_{asym}$ (e.g., as determined from alignment mark asymmetry data 800) and measured overlay $\bar{o}_{meas}$ 820. In such an embodiment, the trained network could then infer the true overlay $\bar{o}_{true}$ directly from the measurements. Such a training embodiment may work better and/or require using actual measurement data rather than simulated data.

It is mentioned above that the measured overlay may comprise single wavelength overlay data. Presently, overlay may be measured using an (at least) three wavelength method (called HMQ) to remove overlay mark asymmetry from the overlay measurement. Further details of HMQ can be found in PCT Patent Application Publication No. WO 2015/018625, which is incorporated herein in its entirety by reference. Very briefly, HMQ comprises measuring a target comprising a +d biased sub-target and a −d biased sub-target with multiple wavelengths, and fitting a line through a plot of asymmetry measurements for the first sub-target against asymmetry measurements for the second sub-target structure, the linear regression model not necessarily being fitted through the origin. The offset from the origin of this line (also referred to as distance to origin DTO) is representative of the target process asymmetry.

However, the MAM (move-acquire-measure) time for the total overlay measurement tends to be directly proportional to the number of wavelengths measured (e.g., the MAM for a three wavelength measurement is approximately three times that of a single wavelength measurement). Because of the long MAM time of present overlay measurements, it is typical to only measure overlay on only one substrate per lot. The proposed method could be used to significantly reduce the MAM (move-acquire-measure) time for (HMQ) overlay as three wavelengths may not be needed, thereby increasing measurement speed and therefore throughput. As such, a measurement may comprise only a single illumination characteristic measurement (e.g., only a single wavelength measurement). Alternatively, or in addition, the proposed method may be used to drive improvements in overlay and yield, by allowing more overlay targets to be measured accurately.

The method of this embodiment may further improve the accuracy of the current HMQ method. Typically, only one substrate per lot is sampled in an overlay measurement without reducing the cluster throughput. The alignment position measurement, which is measured per substrate, can be used on the overlay measurement to determine whether more substrates per lot need to be sampled or if different points per substrate should be measured.

More specifically, it is known that C2C APD is correlated with overlay asymmetry component $\bar{o}_{asym}$, and therefore will be correlated with the HMQ DTO. Using the HMQ methodology, an acceptable range for the DTO can be determined (e.g., it can be compared to a threshold DTO, $DTO_{thres}$). If it is determined that the DTO is outside of the acceptable range (e.g., $\text{abs(DTO)} > DTO_{thres}$), this would indicate that there is a lot of process asymmetry in the overlay mark. The value for the threshold $DTO_{thres}$ can be determined based on a case-by-case basis. There is likely to be a correlation between the threshold $DTO_{thres}$ and yield. As a next step, the function h is determined (as already described). Additionally, a second threshold, this time for the C2C APD is determined (alignment asymmetry threshold C2C $APD_{thres}$), where C2C $APD_{thres}$ is a function of $DTO_{thres}$. This function can be determined by h. Therefore, if it is determined that C2C APD is greater than C2C $APD_{thres}$, the substrate can be flagged as having large asymmetry which will most likely result in large overlay error. As such, this can be seen to be a classification machine learning method, and alignment measurement can be used as a process monitor (e.g., in spec or out of spec) for overlay measurement. This should improve yield.

As explained herein, alignment measurement or overlay measurement is typically based on detecting diffraction orders scattered by a metrology structure. Examples of such metrology structures are, for alignment, alignment marks or, for overlay, overlay marks (comprising at least a bottom grating). The energy comprised within the diffraction order depends on the diffraction efficiency of the metrology structure. This diffraction efficiency partially depends on the pitch and duty cycle of the metrology structure(s) and partially depends on one or more stack characteristics in which the metrology structure is embedded, wherein the stack refers to the one or more layers of material on the substrate and in which the metrology structure is formed.

The mentioned metrology system commonly derives a property of interest associated with the metrology structure based on a metric having measured values of the diffraction order intensities (or energies) as an input. For example, overlay measurement can be based on calculation of a difference in intensity between a first and a minus first diffraction order scattered by the overlay mark. In the case of an overlay measurement the metric is hence a difference between two diffraction order intensities. Typically the measurement using the overlay metrology tool or alignment measurement system is based on signals provided by a sensor positioned in or near a pupil plane, e.g. the diffraction orders are spatially separated at the plane in which the sensor surface lies.

To facilitate accurate measurement of individual diffraction orders it may be necessary to configure the illumination pupil of the measurement radiation source used to illuminate the metrology structure. The illumination pupil may be configured such that there is no, or very limited, overlap between for example the first and minus first diffraction order and between the first diffraction orders and the zero order.

The difference metric scales with the overall diffraction efficiency of the metrology structure, which is largely determined by one or more properties of the stack, and specifically the interaction of the stack and a property (e.g., wavelength, polarization mode, etc.) of the radiation used to illuminate the metrology structure. In case of a small diffraction efficiency the signal generated by the metrology system may be too small to enable accurate determination of the difference metric.

A sufficiently large diffraction efficiency may be achieved by selecting an appropriate wavelength and/or polarization mode of the radiation used for illuminating the metrology structure. For example a measurement of the intensity of a first diffraction order may be performed for a plurality of wavelengths and/or polarization modes. In another example a sum metric of the intensities of the positive first and minus first order may be measured across a range of wavelengths and/or polarization modes, after which a wavelength and/or polarization mode may be selected based on an optimum sum metric associated with the intensities comprised within the positive first and minus first order. The sum metric may be determined based on asymmetry data (as disclosed herein) comprising the intensities of the diffraction orders as measured at a plurality of wavelengths and/or polarization modes. Also the asymmetry data may comprise intensity data of diffraction orders scattered by a plurality of features, for example by alignment marks and overlay (bottom grating) marks.

Once an optimal one or more (e.g., range of) wavelengths and/or polarization modes has been determined based on the sum metric, a more optimal configuration of an overlay metrology tool and/or alignment measurement system may be achieved. For example an optimum wavelength and polarization mode determined by optimizing the sum metric as measured by the overlay metrology tool may be communicated to a computer system configured to optimize the settings of a metrology tool, such as an alignment measurement system or a scatterometer (for example configured to measure overlay of the device manufacturing process). The computer system may subsequently provide an optimized alignment measurement recipe yielding a more accurate position measurement of the alignment mark(s).

The functional dependency of the sum metric on the wavelength and/or polarization mode of the radiation further may be used to monitor the evolution of one or more stack properties due to change in one or more processing steps (e.g. performed by one or more CMP tools, one or more deposition tools or one or more etch tools). When, for example, a CMP tool used in the process drifts in time the thickness of one or more layers comprised within the stack will likely vary. As a result an optimum wavelength and/or polarization mode of the radiation in view of a maximum sum metric is also likely to change as there is a strong coupling between a stack characteristic (e.g. thickness of one or more layers) and the diffraction efficiency of the metrology structure. Hence both the value of the sum metric and its associated optimum wavelength and/or polarization mode of the radiation may be used for monitoring of one or more processing steps applied in manufacturing devices.

In many cases knowledge of the value of the sum metric and/or the optimal wavelength and/or polarization mode may be linked to a precisely determined value of one or more stack parameters. For example a modeled relation between a stack thickness and a diffraction efficiency of the metrology structure may be available. The modeled relation may be used to translate an observed change in the sum metric to a predicted change of the stack thickness. The predicted change in the stack thickness may be used for process control purposes, for example applying a corrective control action to a deposition tool used in applying a layer comprised within the stack and/or a CMP tool used in polishing a layer comprised within the stack. Hence apart from process monitoring, process control also may be based on knowledge of the sum metric and/or an optical property (e.g., wavelength and/or polarization mode) of the radiation used in optimizing the sum metric.

It is recognized that the sum metric is a desirable metric to enable the above mentioned configuring of a metrology system, monitoring of a device manufacturing process or controlling a device manufacturing process. However, in general, knowledge of an integrated intensity or integrated energy of at least a Nth diffraction and a −Nth diffraction order may be sufficient, the integrated intensities or energies typically being added to yield the sum metric. But also a weighted summation may be considered in case one of the diffraction orders is known to be less relevant than the other diffraction order.

The sum metric also may be used as a process parameter indicative of a performance (or quality) parameter such as overlay, CD or focus. In this case a model may be trained correlating the sum metric to measured performance parameter data. The trained model may then be used to predict the performance parameter(s) based on the sum metric and the sum metric may further be used in the context of a virtual/hybrid metrology system, the sum metric for example being used to upsample the performance parameter data (as obtained by direct measurement of the performance parameter for example). In an embodiment a model is trained with sum metric and performance parameter data, and the model is then subsequently used to provide dense performance parameter data across a substrate based on knowledge of the sum metric associated with the substrate.

Further embodiments are disclosed in the list of numbered clauses below:

1. A method for determining a substrate grid describing a deformation of a substrate prior to exposure of the substrate in a lithographic apparatus configured to fabricate one or more features on the substrate, the method comprising:
  obtaining position data for a plurality of first features and/or a plurality of second features on the substrate;
  obtaining asymmetry data for at least a feature of the plurality of first features and/or the plurality of second features;
  determining the substrate grid based on at least the position data; and
  passing the substrate grid and asymmetry data to the lithographic apparatus for controlling at least part of an exposure process to fabricate one or more features on the substrate.

2. The method of clause 1, wherein the determining of the substrate grid is additionally based on the asymmetry data, such that the step of passing the substrate grid and asymmetry data comprises passing an asymmetry corrected substrate grid.

3. The method of clause 1, wherein the plurality of first features comprises alignment marks.

4. The method of clause 3, further comprising obtaining the position data for the alignment marks using a low numerical aperture (NA) optical system comprising a sensor having a NA of less than or equal to 0.9.

5. The method of any of clauses 1-4, wherein the plurality of second features comprises metrology targets and, optionally, overlay targets.

6. The method of clause 5, wherein the plurality of first features comprises alignment marks and further comprising obtaining the asymmetry data for the alignment marks and/or the metrology targets using a high NA optical system comprising a sensor having a NA of greater than 0.9.

7. The method of clause 6, wherein the high NA optical system comprises a plurality of spatially distributed high NA sensors.

8. The method of any of clauses 1-7, further comprising calibrating at least a selection of position data associated with the plurality of second features towards position data associated with the plurality of first features.

9. The method of clause 8, further comprising calibrating at least a selection of the position data towards further position data obtained during the aligning of the substrate in the lithographic apparatus.

10. The method of clause 8, further comprising calibrating further position data obtained during the aligning of the substrate in the lithographic apparatus towards at least a selection of the position data.

11. The method of any of clauses 1-10, further comprising aligning the substrate in the lithographic apparatus based on the substrate grid and the asymmetry data.

12. The method of any of clauses 1-11, further comprising controlling at least part of an exposure process in the lithographic apparatus to fabricate one or more further features thereon based on the substrate grid and asymmetry data, wherein the first and/or second features are located on a first layer and the one or more further features are located on a second, higher layer.

13. The method of any of clauses 1-12, further comprising passing the asymmetry data to a metrology apparatus for measuring overlay.

14. The method of clause 13, further comprising determining overlay data based on the asymmetry data.

15. A measurement apparatus for determining a substrate grid describing a deformation of a substrate prior to exposure of the substrate in a lithographic apparatus configured to fabricate one or more features on the substrate, the measurement apparatus comprising:
  an optical system configured to obtain position data for a plurality of first features and/or a plurality of second features on the substrate,
  wherein the optical system is further configured to obtain asymmetry data for at least a feature of the plurality of first features and/or the plurality of second features, and
  wherein the measurement apparatus is configured to determine the substrate grid based on the position data and pass the substrate grid and asymmetry data to the lithographic apparatus for controlling at least part of an exposure process to fabricate one or more features on the substrate.

16. The measurement apparatus of clause 15, wherein the plurality of first features comprises alignment marks.

17. The measurement apparatus of clause 16, wherein the optical system comprises a low numerical aperture (NA) optical system comprising a sensor having an NA of less than or equal to 0.9 which is configured to obtain the position data for the alignment marks.

18. The measurement apparatus of any of clauses 15-17, wherein the plurality of second features comprises metrology targets and, optionally, overlay targets.

19. The measurement apparatus of clause 18, wherein the plurality of first features comprises alignment marks and wherein the optical system comprises a high NA optical system comprising a sensor having a NA of greater than 0.9 which is configured to obtain the asymmetry data for the alignment marks and/or the metrology targets.

20. The measurement apparatus of clause 19, wherein the high NA optical system comprises a plurality of spatially distributed high NA sensors.

21. The measurement apparatus of clause 20, wherein the plurality of spatially distributed high NA sensors comprises at least one sensor configured to detect radiation having wavelengths that pass through an opaque layer of the substrate, optionally the at least one sensor is an IR (infrared sensor).

22. The measurement apparatus of any of clauses 15-21, wherein the measurement apparatus is configured to calibrate at least a selection of position data associated with the plurality of second features towards position data associated with the plurality of first features.

23. A lithographic apparatus configured to use the substrate grid and asymmetry data of clause 1, wherein the lithographic apparatus is configured to align the substrate in the lithographic apparatus based on the position data and/or the asymmetry data.

24. The lithographic apparatus of clause 23, wherein the lithographic apparatus comprises a metrology apparatus configured to determine overlay data based on the asymmetry data.

25. The lithographic apparatus of clause 23, comprising the measurement apparatus of clause 15.

26. A method for determining a value for a process parameter measurement error obtained from measurement of a substrate subject to a manufacturing process and comprising a target having a process distortion, the process parameter measurement error being a result of the process distortion, the method comprising:
 obtaining alignment asymmetry data describing asymmetry in one or more alignment marks used for aligning the substrate;
 obtaining a model correlating alignment asymmetry data to the process parameter measurement error; and
 using the alignment asymmetry data and the model to obtain the value of the process parameter measurement error.

27. The method of clause 26, wherein the process parameter is overlay.

28. The method of clause 26 or clause 27, wherein the alignment asymmetry data comprises a difference in a first measured position of the one or more alignment marks when measured using radiation with a first characteristic and a second measured position of the one or more alignment marks when measured using radiation with a second characteristic.

29. The method of clause 28, wherein the characteristic which is varied between the first characteristic and the second characteristic is wavelength and/or polarization.

30. The method of any of clauses 26 to 29, comprising determining a correction for a measurement of the process parameter from the process parameter measurement error.

31. The method of clause 30, wherein the measurement of the process parameter is based on a measurement of the target performed with a single illumination characteristic measurement.

32. The method of any of clauses 26 to 31, comprising performing a calibration stage to calibrate the model.

33. The method of clause 32, wherein the calibration stage is performed using simulated training data comprising simulated targets and simulated alignment marks, and simulated measurement responses of the simulated targets and simulated alignment marks.

34. The method of clause 33, wherein the calibration stage calibrates the model, such that the model can characterize the process parameter measurement error based on the alignment asymmetry data.

35. The method of any of clauses 26 to 34, wherein the model comprises a neural network.

36. The method of any of clauses 26 to 35, wherein the alignment asymmetry data is further used to determine whether the manufacturing process is within specification.

37. The method of clause 36, comprising determining an amendment to a metrology action for measuring the process parameter based on the determination as to whether the manufacturing process is within specification.

38. The method of any of clauses 26 to 37, comprising reducing the number of acquisitions of a metrology action to measure the process parameter, wherein each acquisition is performed with a different illumination characteristic.

39. The method of any of clauses 26 to 37, comprising comparing the alignment asymmetry data to an alignment asymmetry threshold and categorizing the substrate based on the comparison.

40. The method of clause 39, wherein the categorizing the substrate comprises determining whether the substrate is within or outside of specification based on the comparison.

41. A lithocell comprising a lithographic apparatus, a metrology apparatus, and at least one processor operable to perform the method of any of clauses 26-40.

42. The lithocell of clause 41, wherein the lithographic apparatus is operable to perform alignment measurement to obtain the alignment asymmetry data; and the metrology apparatus is operable to measure the process parameter; wherein the at least one processor is operable to correct the measured process parameter using the value of the process parameter measurement error.

43. A method for configuring a metrology tool used in a device manufacturing process, the method comprising: obtaining an integrated intensity or integrated energy comprised within a +Nth and −Nth order of diffraction scattered from a metrology structure applied to a layer on a substrate illuminated at a plurality of wavelengths and/or polarization modes; and configuring the metrology tool based on the dependency of the integrated intensity or integrated energy to the wavelength and/or polarization mode, wherein the configuring provides at least selection of a wavelength and/or polarization mode of a source of radiation within or for the metrology tool.

44. A method for monitoring a device manufacturing process, the method comprising: obtaining an integrated intensity or integrated energy comprised within a +Nth and −Nth order of diffraction scattered from a metrology structure applied to a layer on a substrate illuminated at a plurality of wavelengths and/or polarization modes; and monitoring the manufacturing process based on a property of the dependency of the integrated intensity or integrated energy to the wavelength and/or polarization mode.

45. A method for controlling a device manufacturing process, the method comprising: obtaining an integrated intensity or integrated energy comprised within a +Nth and −Nth order of diffraction scattered from a metrology structure applied to a layer on a substrate illuminated at a plurality of wavelengths and/or polarization modes; and controlling a processing apparatus used in the manufacturing process based on a property of the layer derived from the dependency of the integrated intensity or integrated energy to the wavelength and/or polarization mode.

46. The method of any of clauses 43, 44 or 45, wherein the obtaining is based on measurement data provided by a measurement device.

47. The method of clause 46, wherein the measurement device comprises an alignment system.

48. The method of any of clauses 43 to 47, wherein the metrology structure comprises an alignment mark.

49. The method of clause 46, wherein the measurement device comprises a scatterometer.

50. The method of any of clauses 43 to 49, wherein the metrology structure comprises a bottom grating of an overlay mark.

51. The method of clause 46, wherein the obtaining is based on measurement within a pupil plane of the measurement device.

52. The method of clause 51, wherein the illuminating of the metrology structure uses a radiation source having an illumination pupil configured to have no, or very limited, overlap between diffractions orders and/or overlap between a diffraction order and the zero order.

53. The method of any of clauses 43 to 52, wherein the obtaining further comprises summation of the integrated intensities and/or integrated energies comprised within the +Nth and −Nth diffraction orders.

54. The method of clause 1, wherein the asymmetry data further comprises intensity data or energy data of individual diffraction orders scattered from the first and/or second features illuminated at a plurality of wavelengths and/or polarization modes.

55. The method of clause 54, further comprising: obtaining an integrated intensity or integrated energy comprised within a +Nth and/or −Nth order of diffraction at the plurality of wavelengths and/or polarization modes based on the asymmetry data; and monitoring a device manufacturing process based on a property of the dependency of the integrated intensity or integrated energy to the wavelength and/or polarization mode.

56. The method of clause 54, further comprising: obtaining an integrated intensity or integrated energy comprised within a +Nth and/or −Nth order of diffraction at the plurality of wavelengths and/or polarization modes based on the asymmetry data; and controlling a processing apparatus used in a device manufacturing process based on a property of the layer derived from the dependency of the integrated intensity or integrated energy to the wavelength and/or polarization mode.

57. The method of clause 54, further comprising: obtaining an integrated intensity or integrated energy comprised within a +Nth and/or −Nth order of diffraction at the plurality of wavelengths and/or polarization modes based on the asymmetry data; and configuring a metrology tool based on the dependency of the integrated intensity or integrated energy to the wavelength and/or polarization mode, wherein the configuring provides at least selection of a wavelength and/or polarization mode of a source of radiation within or for the metrology tool.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a patterning device (e.g., mask) inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
obtaining position data, measured outside of a lithographic apparatus configured to fabricate one or more features on a substrate, for a plurality of first features and/or a plurality of second features on the substrate;
obtaining asymmetry data for at least a feature of the plurality of first features and/or the plurality of second features;
determining, by a hardware computer system, the substrate grid based on at least the position data, the determined substrate grid describing deformation across the substrate prior to exposure of the substrate in the lithographic apparatus; and
passing the substrate grid and asymmetry data to the lithographic apparatus for controlling at least part of an exposure process to fabricate one or more features on the substrate.

2. The method of claim 1, wherein the determining of the substrate grid is additionally based on the asymmetry data, such that the passing the substrate grid and asymmetry data comprises passing an asymmetry corrected substrate grid.

3. The method of claim 1, wherein the plurality of first features comprises alignment marks.

4. The method of claim 3, further comprising obtaining the position data for the alignment marks using a low numerical aperture (NA) optical system, comprising a sensor, having a NA of less than or equal to 0.9.

5. The method of claim 1, wherein the plurality of second features comprises metrology targets.

6. The method of claim 5, wherein the plurality of first features comprises alignment marks and further comprising obtaining the asymmetry data for the alignment marks and/or metrology targets of the plurality of second features, using a high NA optical system, comprising a sensor, having a NA of greater than 0.9.

7. The method of claim 1, further comprising calibrating at least a selection of position data associated with the plurality of second features towards position data associated with the plurality of first features.

8. The method of claim 7, further comprising calibrating at least a selection of the position data towards further position data obtained during the aligning of the substrate in the lithographic apparatus.

9. The method of claim 1, further comprising passing the asymmetry data to a metrology apparatus for measuring overlay.

10. The method of claim 1, wherein the asymmetry data further comprises intensity data or energy data of diffraction orders scattered from the first features and/or second features at a plurality of wavelengths and/or polarization modes.

11. The method of claim 10, further comprising:
obtaining, based on the asymmetry data, an integrated intensity or integrated energy comprised within a +Nth and/or −Nth order of diffraction at the plurality of wavelengths and/or polarization modes; and
configuring a metrology tool based on the dependency of the integrated intensity or integrated energy to the wavelength and/or polarization mode, wherein the configuring provides at least selection of a wavelength and/or polarization mode of a source of radiation within or for the metrology tool.

12. A lithographic apparatus configured to use the substrate grid and asymmetry data of claim 1, wherein the lithographic apparatus is configured to align the substrate in the lithographic apparatus based on the position data and/or the asymmetry data.

13. A measurement apparatus comprising:
an optical system outside of a lithographic apparatus configured to fabricate one or more features on a substrate, the optical system configured to obtain position data for a plurality of first features and/or a plurality of second features on the substrate,
wherein the optical system is further configured to obtain asymmetry data for at least a feature of the plurality of first features and/or the plurality of second features, and
wherein the measurement apparatus is configured to determine the substrate grid based on at least the position data, the determined substrate grid describing deformation across the substrate prior to exposure of the substrate in the lithographic apparatus, and pass the substrate grid and asymmetry data to the lithographic apparatus for controlling at least part of an exposure process to fabricate one or more features on the substrate.

14. The measurement apparatus of claim 13, wherein the optical system comprises a low numerical aperture (NA) optical system, comprising a sensor, having an NA of less than or equal to 0.9 which is configured to obtain the position data.

15. The measurement apparatus of claim 14, further comprising a plurality of spatially distributed high NA sensor systems.

16. A computer program product comprising a non-transitory computer-readable medium having instructions, the instructions, upon execution by a computer system, configured to cause the computer system to at least:
obtain position data, measured outside of a lithographic apparatus configured to fabricate one or more features on a substrate, for a plurality of first features and/or a plurality of second features on the substrate;
obtain asymmetry data for at least a feature of the plurality of first features and/or the plurality of second features;
determine a substrate grid based on at least the position data, the determined substrate grid describing deformation across the substrate prior to exposure of the substrate in the lithographic apparatus; and
pass the substrate grid and asymmetry data toward the lithographic apparatus for controlling at least part of an exposure process to fabricate one or more features on the substrate.

17. The computer program product of claim 16, wherein the instructions configured to cause the computer system to determine the substrate grid are further configured to determine the substrate grid additionally based on the asymmetry data, such that the passing of the substrate grid and asymmetry data comprises passing of an asymmetry corrected substrate grid.

18. The computer program product of claim 16, wherein the plurality of first features comprises alignment marks and wherein the instructions configured to cause the computer system to obtain the position data are further configured to obtain the position data for the alignment marks as measured using a low numerical aperture (NA) optical system, comprising a sensor, having a NA of less than or equal to 0.9.

19. The computer program product of claim 16, wherein the instructions are further configured to cause the computer system to obtain the asymmetry data for the plurality of second features as measured using a high NA optical system, comprising a sensor, having a NA of greater than 0.9.

20. The computer program product of claim 16, wherein the instructions are further configured to cause the computer system to calibrate at least a selection of position data associated with the plurality of second features towards position data associated with the plurality of first features.

* * * * *